(12) United States Patent  
Chakraborty et al.

(10) Patent No.: US 8,786,330 B1
(45) Date of Patent: Jul. 22, 2014

(54) SYSTEM AND METHOD FOR A FREQUENCY DOUBLER

(71) Applicant: Infineon Technologies AG, Neubiberg (DE)

(72) Inventors: Abhiram Chakraborty, Unterhaching (DE); Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/797,187

(22) Filed: Mar. 12, 2013

(51) Int. Cl.
*H03B 19/00* (2006.01)
(52) U.S. Cl.
USPC .......................................... 327/122; 327/119
(58) Field of Classification Search
USPC ........................... 327/113, 114, 116, 119, 122
See application file for complete search history.

(56) References Cited

U.S. PATENT DOCUMENTS

| 6,664,824 | B2 | 12/2003 | Laws |
| 8,330,506 | B2* | 12/2012 | Trotta et al. ................... 327/122 |
| 2011/0215844 | A1 | 9/2011 | Trotta et al. |

FOREIGN PATENT DOCUMENTS

JP          62176308 A    *   8/1987             H03B 19/14

OTHER PUBLICATIONS

Forstner, Hans Deter, et al., "Frequency Quadruplers for a 77GHz Subharmonically Pumped Automotive Radar Transceiver in SiGe," Infineon Technologies AG, Neubiberg, Germany, Microwave Integrated Circuits Conference, Sep. 28, 2009, 4 pages.

Haung, Bo-Jiun, et al., "A GaAs-Based HBT 31-GHz Frequency Doubler with an On-Chip Voltage," Dec. 16, 2008, IEEE, 4 pages.

Hung, Juo-Jung, et al., "High-Power High-Efficiency SiGe Ku- and Ka- Band Balanced Frequency Doublers," IEEE Transactions on Microwave Theory and Techniques, vol. 53, No. 2, Feb. 2005, pp. 754-761.

Hackl, Sabine, et al., "A 45 GHz SiGe Active Frequency Multiplier," IEEE International Solid-State Circuits Conference, Feb. 4, 2002, 3 pages.

Yeh, Han-Chih, et al., "Analysis and Design of Millimeter-Wave Low-Power CMOS LNA with Transformer-Multicascode Topology," IEEE Transactions on Microwave Theory and Techniques, vol. 59, No. 12, Dec. 2011, pp. 3441-3454.

* cited by examiner

*Primary Examiner* — Patrick O'Neill
(74) *Attorney, Agent, or Firm* — Slater & Matsil, L.L.P.

(57) ABSTRACT

In accordance with an embodiment, a frequency doubling circuit includes a differential transistor pair coupled to an input port of the frequency doubling circuit, a first differential cascode stage having an input coupled to an output of the differential transistor pair, a plurality of first impedance elements coupled between the output of the differential transistor pair and the input of the first differential cascode stage, and an output combining network coupled between the first differential cascode stage and an output port of the frequency doubling circuit.

22 Claims, 7 Drawing Sheets

SYSTEM AND METHOD FOR A FREQUENCY DOUBLER

TECHNICAL FIELD

This invention relates generally to semiconductor circuits and methods, and more particularly to a system and method for frequency doubler.

BACKGROUND

Applications in the mm-wave frequency regime have gained significant interest in the past few years due to the rapid advancement in low cost semiconductor technologies like silicon germanium (SiGe) and fine geometry complementary metal-oxide semiconductor (CMOS) processes. Availability of high speed bipolar and MOS transistors has led to a growing demand for integrated circuits for mm-wave applications at 60 GHz, 77 GHz, and 80 GHz and also beyond 100 GHz. Such applications include, for example, automotive radar and multi-gigabit communication systems.

As the operating frequencies of RF systems continue to increase, the generation of signals at such high frequencies poses a major challenge. Oscillators that operate at high frequencies may suffer from a poor phase noise performance and a low output power in some systems. Moreover, frequency dividers used in phase locked loops (PLLs) at such high frequencies may consume a significant amount of power.

One way in which the challenges of generating high frequency signal is addressed is through the use of frequency multipliers. For example, a voltage controlled oscillator (VCO) combined with a frequency doubler may be used to generate a high frequency signal. By operating the VCO at one-half of the output frequency enables a system to generate a high frequency signal having better phase noise and higher output power than a VCO configured to operate at the full output frequency. However, the design of frequency multipliers at mm-wave frequencies poses its own set of design challenges including the ability to provide a high output power and the ability to reject the fundamental input frequency.

SUMMARY OF THE INVENTION

In accordance with an embodiment, a frequency doubling circuit includes a differential transistor pair coupled to an input port of the frequency doubling circuit, a first differential cascode stage having an input coupled to an output of the differential transistor pair, a plurality of first impedance elements coupled between the output of the differential transistor pair and the input of the first differential cascode stage, and an output combining network coupled between the first differential cascode stage and an output port of the frequency doubling circuit.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a frequency doubling circuit. The invention may also be applied, however, to other types of circuits, systems, and methods directed toward high frequency RF communication systems.

Embodiments of the present invention implement frequency doubling circuits by coupling a differential input pair with a cascode stage via transmission line elements in order to provide peaking, and coupling the output of the cascode stage with a harmonic filter. The cascode structure obtains may be used to obtain a high conversion gain and output power, and the use of the transmission line elements between the differential input pair and the cascode stage boosts the gain and output power at the second harmonic of the input frequency. The output filter may be formed as a resonant network to enhance the output power at the second harmonic and provides a strong rejection of the fundamental input signal.

Embodiment frequency doubling circuits may be used in a variety of contexts. For example, an embodiment frequency doubler may be used inside a transmitter of a RF signal generator as a local oscillator (LO) signal source in combination with a voltage controlled oscillator (VCO), or an external signal source. Embodiment frequency doubling circuits may also be used in the implementation of RF transceiver circuits. For example, a frequency doubler may serve as an LO signal source for a transmitter, as well as an LO source for mixers in the receiver and/or an external signal source.

Figure 1:
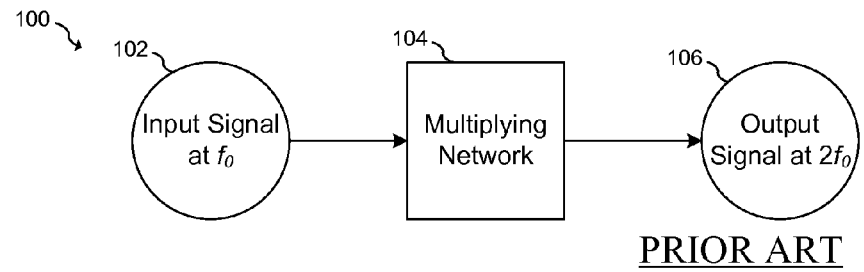
FIG. 1 illustrates a block diagram of a generic frequency doubler.

FIG. 1 illustrates a block diagram of an example system that may be used to double the frequency of an input signal. Input signal 102 having a frequency of $f_0$ is coupled to an input of multiplying network 104 that produces output signal 106 having a frequency of $2f_0$. Multiplying network 104 may be implemented in any number of ways. At its most basic level, multiplying network 104 introduces a second order nonlinearity that produces a harmonic at twice the frequency of the input. This second order nonlinearity may be produced, for example, using a nonlinear semiconductor device, such as a diode. In other conventional approaches, this second order nonlinearity, in particular the squared term (i.e., $x^2$) may be produced using an analog multiplier circuit, such as a Gilbert mixer, in which the input signal is coupled to both input ports. While such conventional solutions offer acceptable performance at lower frequencies, maintaining performance presents various challenges as input frequencies increase toward the millimeter wave range. Such challenges include signal attenuation caused, in part, by device parasitics and process variation that becomes more prominent at higher frequencies.

Figure 2A:
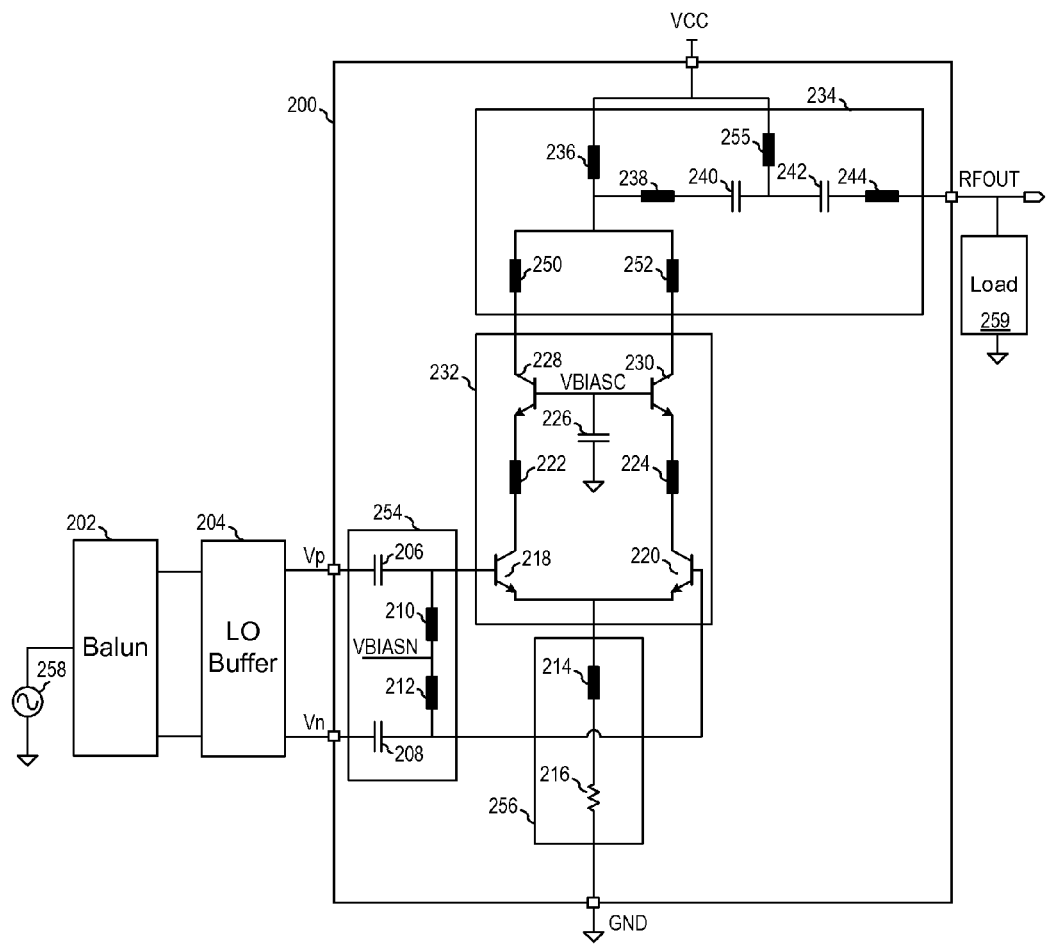
FIGS. 2a-b illustrate schematics of embodiment frequency doubler circuits.

FIG. 2a illustrates frequency doubler circuit 200 according to an embodiment of the present invention that includes cascode core 232, harmonic filter 234, input coupling network 254 and bias network 256. Balun 202 and LO buffer 204 are shown coupling signal source 258 to input coupling network 254, however it should be understood that embodiment frequency doubler may be coupled to various signal sources types in different manners. In embodiments, signal source 258 provides an input frequency of $f_o$ and frequency doubler circuit 200 provides a signal having a frequency of $2f_0$ at output port RFOUT.

Cascode core 232 includes a differential input pair made of transistors 218 and 220, the collectors of which are coupled to the emitters of a cascode stage that include transistors 228 and 230. In an embodiment, cascode transistors 228 and 230 are biased with bias voltage VBIASC and decoupled to ground via capacitor 226. Transistors 218, 220, 228 and 230 may be implemented, for example, using bipolar junction transistors (BJTs) or field effect transistors such as metal-oxide field effect transistors (MOSFETs), junction field effect transistors (JFETs), and other transistor types. In the illustrated embodiment, the cascode stage is implemented using BJT transistors 228 and 230 that are configured in a common-base configuration. It should be understood, however, that in embodiments using field effect transistors, the cascode stage may be implemented using MOSFETs or JFETs in a common gate configuration, or other device types in an equivalent configuration. Interstage matching between the differential input pair and the cascode stage is provided by transmission line elements 222 and 224 that may be used to enhance the gain and the output power provided by the cascode core 232, which is coupled to ground via bias network 256 that includes resistor 216 and optional transmission line element 214. In an embodiment, transmission line element 214 is a quarter wave transmission line at twice the input frequency $2f_0$; however, other transmission line element lengths may be used.

Harmonic filter 234 includes passive elements 250, 252, 236,238,240, 255,242 and serves two primary purposes, namely, rejection of the fundamental at frequency $f_0$ and enhancement of the second harmonic output power at load 259. Harmonic filter 234 may be viewed, for example, as a circuit that shunts out the fundamental signal at frequency $f_0$ and effectively transfers the second harmonic signal at $2f_0$ to load 250. Transmission line elements 250 and 252 coupled to the collectors of transistors 228 and 230, respectively, may enhance the gain of the system by resonating out the parasitic capacitance at the collectors of transistors 228 and 230. The circuit is then matched to the output using the passive elements 238, 240, 255, 242 and 244. In some embodiments, transmission line elements 250 and 252 are about a quarter wavelength at fundamental frequency $f_0$ in order to provide good rejection of the fundamental frequency. In other embodiments, transmission lines 250 and 252 may be designed to achieve the maximum output power at the second harmonic and maximum fundamental rejection in combination with the other passive elements of the resonant network of harmonic filter 234. It should be understood that as the frequency of operation get lower, the length of a quarter wavelength line for a fundamental frequency becomes larger.

Transmission line 236 provides a DC bias current to cascode core 232, and may be configured to be a quarter wavelength at output frequency $2f_0$ in order to provide a high output signal. Moreover, transmission line elements 238, 255 and 244, along with capacitors 240 and 242 form a matching network to port RFOUT in order to provide a match to load 259.

Input coupling network 254 includes AC coupling capacitors 206 and 208 and transmission line elements 210 and 212. In one embodiment, transmission line elements 210 and 212 are configured to be quarter-wave transmission lines at input frequency $f_0$, and are used to provide DC bias voltage VBIASIN to the bases of transistors 218 and 220.

In an embodiment, frequency doubler circuit 200 is implemented on an integrated circuit, and configured to provide a 120 GHz output signal given a 60 GHz output signal at the input signal source 258. In this example embodiment, each transmission line element is a line having a 5 μm with in a top metal layer over a 15 μm wide grounds in a lower metal layer. Transmission line elements 210 and 212 within input network 254 each have a length of about 630 μm, transmission line 214 within bias network 256 has a length of about 65 μm, transmission line elements 222 and 224 within cascode stage 232 have a length of about 55 μm, transmission line elements 250 and 252 have a length of about 330 μm, transmission line elements 236, 238, 255 and 244 within harmonic filter 234 have a lengths of about 310 μm, 40 μm, 150 μm, and 250 μm, respectively. The bias current through cascode core 232 is about 9 mA, and the DC current flowing though LO buffer 204 is about 21 mA. Under large signal conditions, the current consumption of cascode core 232 may increase to about 20 mA depending on the input signal level. This increased current consumption includes about 9 mA of bias current and up to about 11 mA of additional current consumption due to the large signal excitation of the circuit. It should be understood that the abovementioned frequency of operation and transmission line element dimensions, bias current and other implementation details are just one example of many possible embodiments. In alternative embodiments of the present invention, different transmission lengths and widths different operating frequencies, and different power current consumption levels may be used. In further alternative embodiments, some or all of transmission line segments 210, 212, 214, 222, 224, 250, 252, 236, 238, 255 and 244 may be replaced with inductors.

Figure 2B:
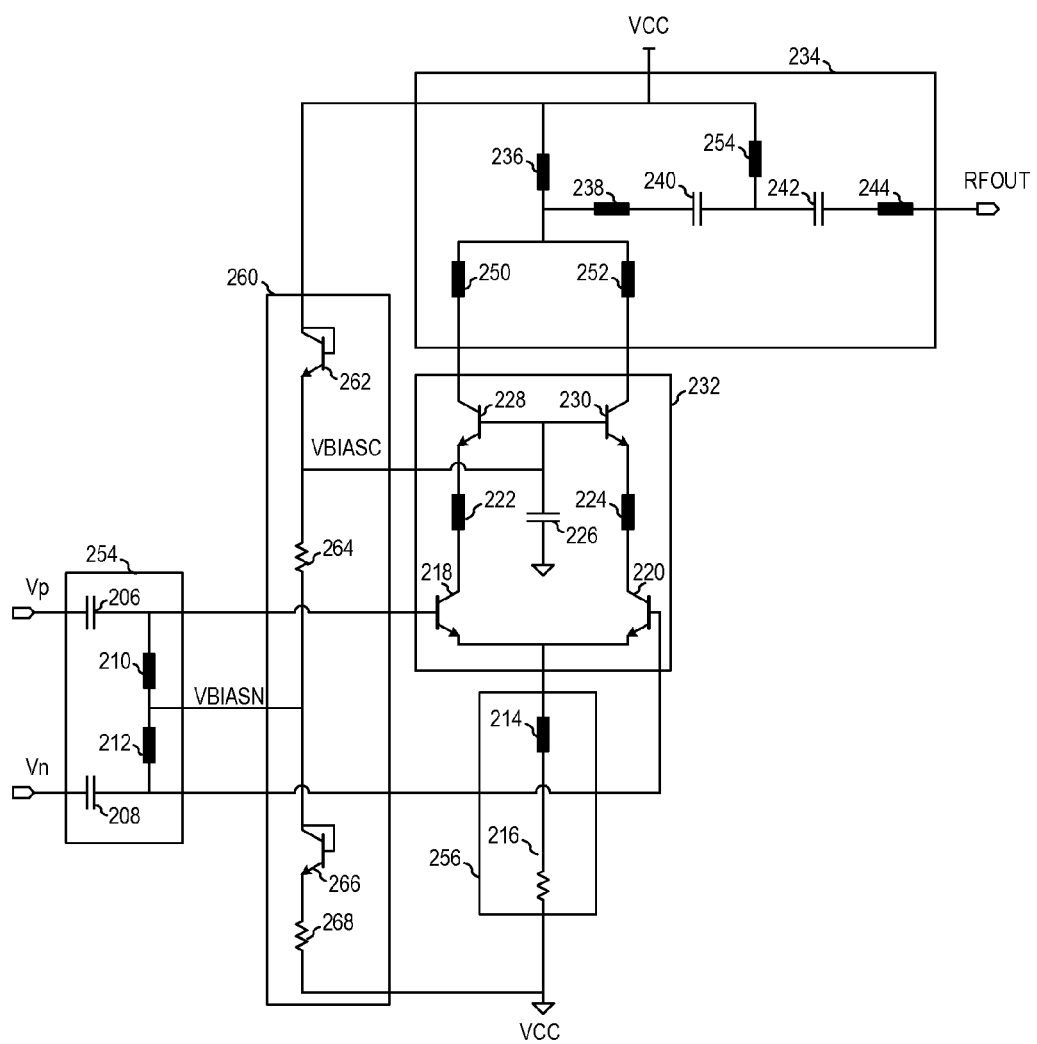

FIG. 2b illustrates an embodiment frequency doubler circuit similar to the embodiment shown in FIG. 2a that further includes bias generator 260. Bias generator 260 includes diode-connected transistors 262 and 266, and resistors 264 and 268 coupled in series. The bases of cascode transistors 228 and 230 are coupled to the emitter of transistor 262, and the bases of differential pair transistors 218 and 220 are coupled to the collector of transistor 266 via transmission line elements 210 and 212, which effectively transform the low impedance at the collector of transistor 266 to a high impedance at the bases of transistors 218 and 220 at input frequency $f_0$. It should be understood that bias generator 260 is just one example of many bias generator circuit that may be used to bias embodiment frequency doubler circuits. In alternative embodiments, other bias circuits and biasing techniques known in the art may also be used.

Figure 3:
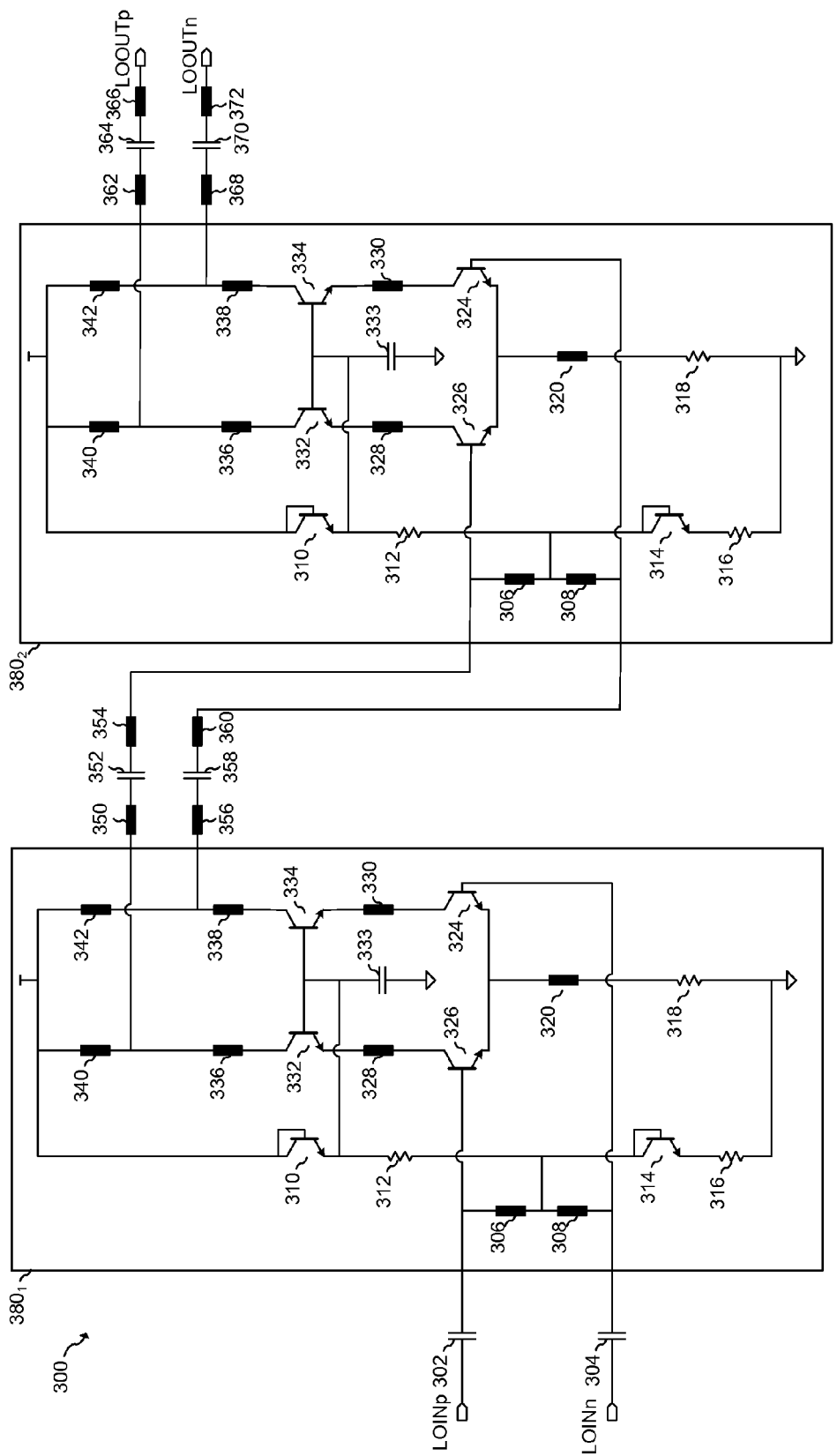
FIG. 3 illustrates a schematic of an embodiment LO buffer circuit.

FIG. 3 illustrates an embodiment LO buffer 300 that may be used, for example, to implement LO buffer 204 shown in FIG. 2a. LO buffer 300 has two LO buffer stages $380_1$ and $380_2$ that each contains a differential input pair made of transistors 326 and 324 coupled to cascode transistors 332 and 334 via transmission line elements 328 and 330. In the depicted embodiment, two stages are used to ensure sufficient input power at fundamental frequency $f_0$ to the frequency doubler at high frequencies. In alternative embodiments, greater or fewer than two LO buffer stages may be used depending on the particular embodiments and its specifications.

The differential input pair is biased by resistor 318 and transmission line element 320, which represents an interconnection transmission line between resistor 318 and the emitters of transistors 326 and 324. Transmission line elements 336 and 338 are coupled to the collectors of transistors 332 and 334 respectively. Transmission elements 340 and 342 are coupled to VCC and provide power supply current therefrom. The input of each LO buffer stage $380_1$ and $380_2$ has transmission line elements 306 and 308 that provide a DC bias current to input differential pair transistors 326 and 324, and the output of each LO buffer stage $380_1$ and $380_2$ are taken from the collectors of cascode transistors 332 and 334 via transmission line elements 336 and 338 respectively. Transmission line elements 306 and 308 may be implemented using quarter wavelength RF chokes. A bias network formed by a series connection of transistor 310, resistor 312, transistor 314 and resistor 316 provides DC bias voltages for the input differential pair made of transistors 326 and 304 and the bases of cascode transistors 332 and 334. The bias connection to transistors 332 and 334 are decoupled to ground via capacitor 333, which may be implemented using an RF capacitor for proper grounding. Passive elements 336, 338, 340, 342, 350-360 and 362-372 form interstage matching networks including transmission lines and capacitors that may be configured, for example, to provide maximum power transfer between stages.

Interstage coupling and matching between the two LO buffer stages $380_1$ and $380_2$ are provided by AC coupling capacitors 352 and 358, and transmission line elements 350, 354, 356 and 360 may be configured to provide an impedance match between the output of the first stage and the input of the second stage of LO buffer stages 380. Coupling capacitors 302 and 304 are coupled to the input of LO buffer stage $380_1$, and AC coupling capacitors 364 and 370, along with transmission line elements 362, 366, 368 and 372 are coupled to the output of LO buffer stage $380_2$. It should be appreciated that LO buffer 300 illustrated in FIG. 3 is just one example of many possible LO buffer circuits that may be used to provide the input signal to embodiment frequency doublers. In alternative embodiments of the present invention, other LO buffer circuits and architectures know in the art may be used.

Figure 4A:
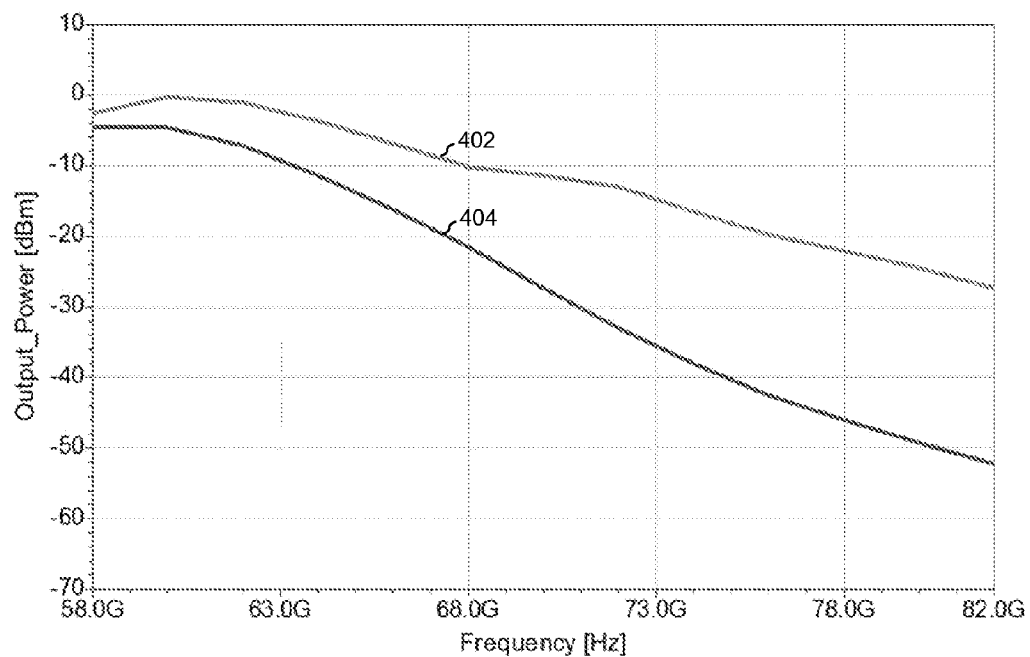
FIGS. 4a-e illustrate performance comparison graphs of embodiment frequency doublers.

FIG. 4a illustrates a plot of output power delivered to a 50Ω load versus frequency for two example frequency doublers. Trace 402 is a plot of output power versus frequency for the embodiment frequency doubler shown in FIG. 2a, and trace 404 is an output power versus frequency graph for a frequency doubler having a common emitter configuration, which is essentially the frequency doubler illustrated in FIG. 2a with cascode transistors 228 and 230 removed. As shown, the output power of the frequency doubler using the cascode stage is higher than the frequency doubler that does not use the cascode stage. As can further be seen, the amplitude of trace 404 decreases rapidly at higher frequencies. The enhanced performance provided by cascode transistors 228 and 230 is due, in part, to the reduction of the Miller effect with respect to a common emitter configuration. The x-axis, which ranges from 58 GHz to 82 GHz, represents the input frequency $f_0$ delivered to the input of the frequency doubler.

Figure 4B:
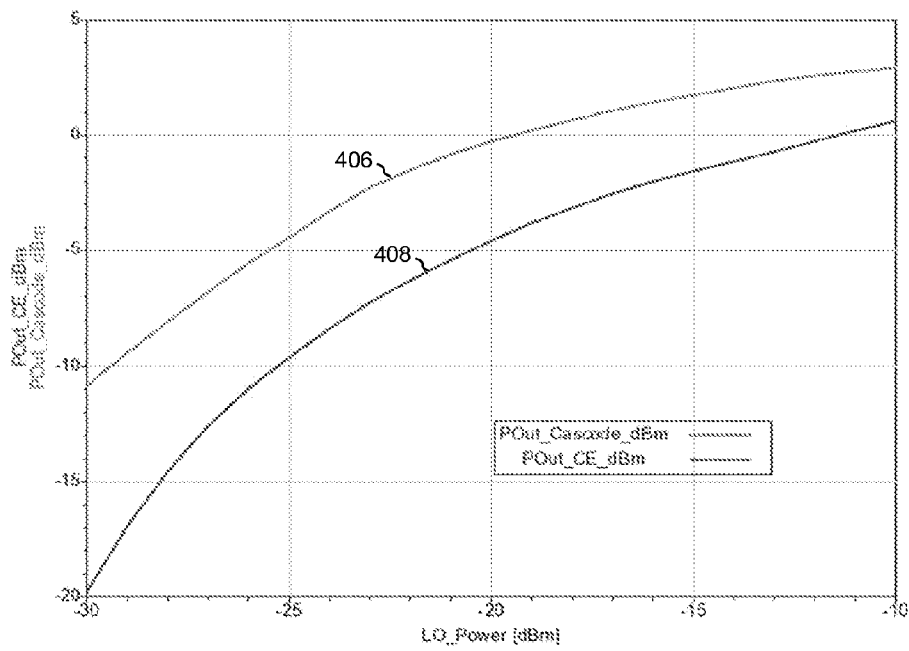
Figure 4C:
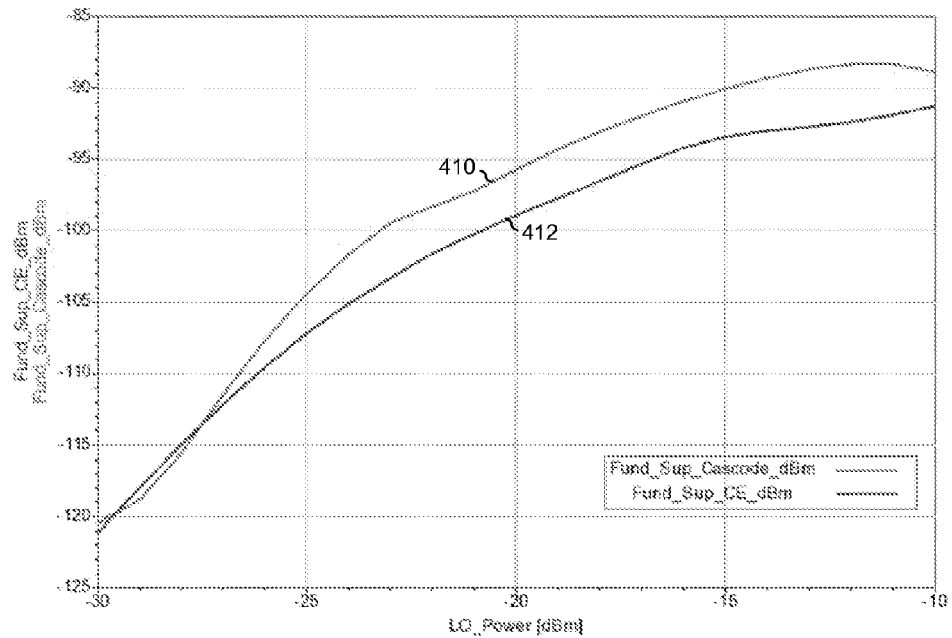

FIG. 4b illustrates a plot of output power versus LO input power for two example frequency doublers. Trace 406 represents the performance of the embodiment frequency doubler shown in FIG. 2a, and trace 408 represents the performance of the frequency doubler having a common emitter configuration without cascode transistors. The performance graph shown by FIG. 4b represents an input frequency $f_0$ of 61 GHz, and an output frequency $2f_0$ of 121 GHz. As shown, the cascode embodiment of FIG. 2A has a higher output power than a common emitter embodiment without cascode transistors. FIG. 4c illustrates a plot of fundamental suppression vs. LO input power under the same conditions as those used to generate the plot of FIG. 4b. Trace 410 represents the fundamental rejection of the embodiment frequency doubler shown in FIG. 2a, and trace 412 represents the fundamental suppression of the frequency doubler the frequency doubler having a common emitter configuration without cascode transistors.

Figure 4D:
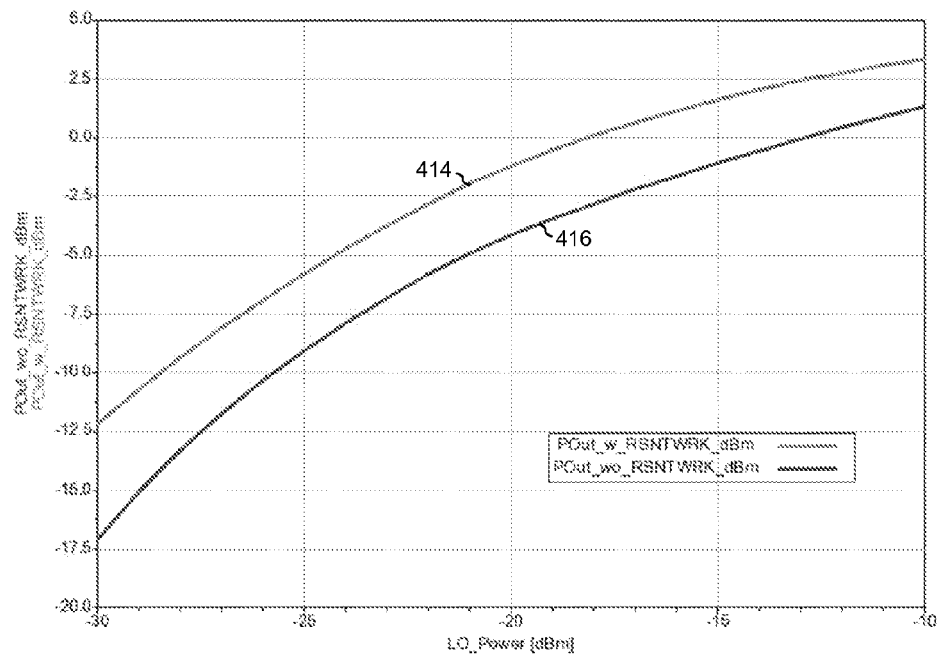

FIG. 4d illustrates a plot of output power vs. LO input power. Trace 414 represents the output power of the embodiment frequency doubler shown in FIG. 2a, and trace 416 represents the output of the frequency doubler shown in FIG. 2a with transmission line elements 250 and 252 removed (i.e. the collectors of transistors 228 and 230 are directly connected together). As shown, the embodiment of FIG. 2a having transmission line elements 250 and 252 has about 4 dB higher output power than an embodiment without transmission line elements 250 and 252, which provide an impedance match between the differential input pair and the cascode stage. The performance graph shown by FIG. 4d represents an input frequency $f_0$ of 61 GHz, and an output frequency $2f_0$ of 121 GHz.

Figure 4E:
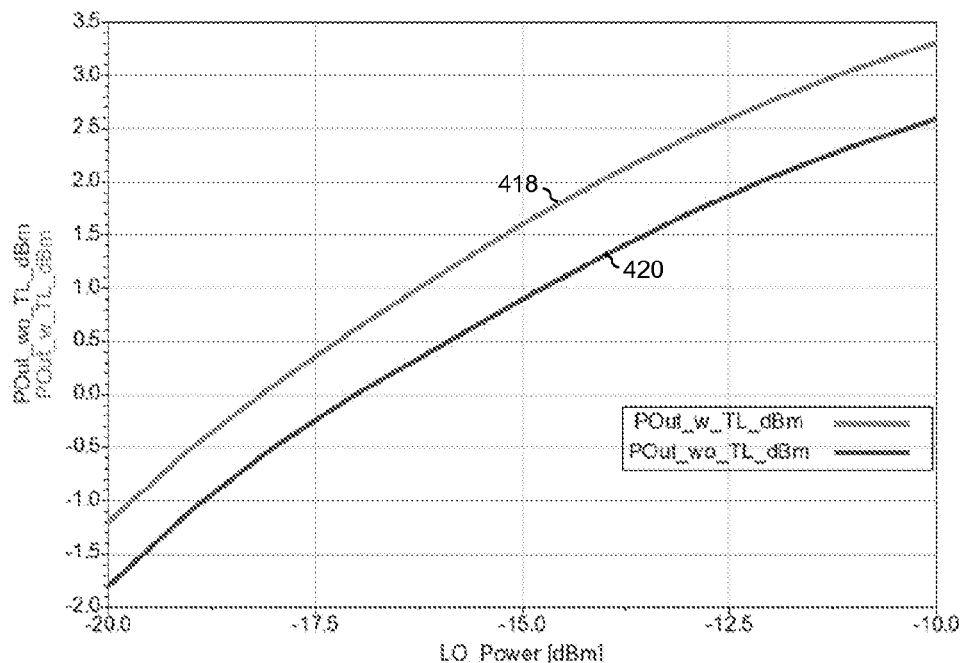

FIG. 4e illustrates a plot of output power vs. LO input power. Trace 418 represents the output power of the embodiment frequency doubler shown in FIG. 2a, and trace 420 represents the output of the frequency doubler shown in FIG. 2A with transmission line elements 222 and 224 removed (i.e. the collectors of transistors 218 and 220 are directly connected to the emitters of transistors 228 and 230 respectively). As shown, the embodiment of FIG. 2A having transmission line elements 222 and 224 has better than a 1.5 dB higher output power than an embodiment without transmission line elements 222 and 224. The performance graph shown by FIG. 4e represents an input frequency $f_o$ of 61 GHz, and an output frequency $2f_0$ of 121 GHz.

Figure 5:
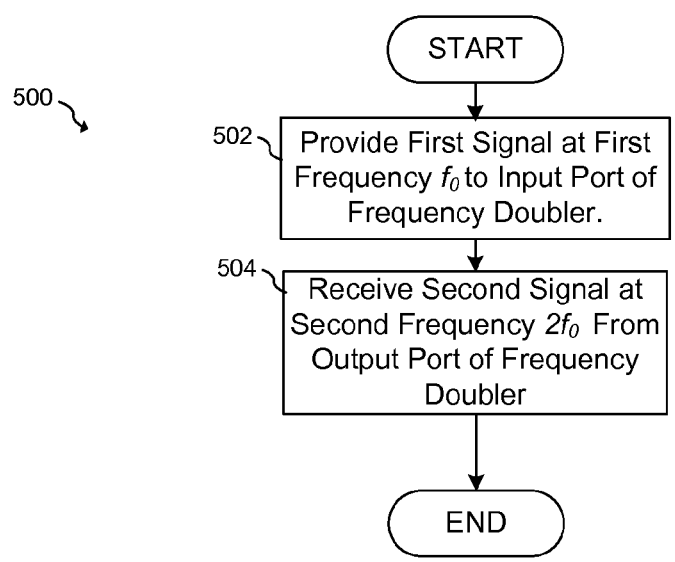
FIG. 5 illustrates a block diagram of an embodiment method.

FIG. 5 illustrates a flowchart of embodiment method 500 of operating an embodiment frequency doubler. In an embodiment, a first signal at a first frequency $f_0$ is provided to an embodiment frequency doubler circuit at step 502. In some embodiments, this first frequency is 30 GHz or greater. Next, in step 504, a second signal at a second frequency $2f_0$ is received from the embodiment frequency doubler circuit.

Figure 6:
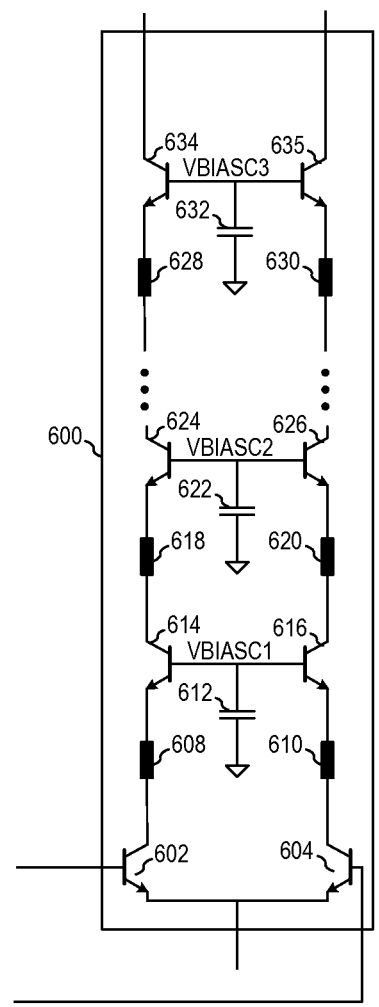
FIG. 6 illustrates a further embodiment of a cascode of a frequency doubler.

FIG. 6 illustrates an alternative embodiment of a cascode core 600 having a multi-cascode architecture that may be used, for example, in place of cascode core 232 described hereinabove with respect to FIGS. 2a-b. Cascode 600 has an input differential pair made of transistors 602 and 604, and a number of cascode stages represented as a first cascode stage having transistors 614 and 616 and transmission line elements 608 and 610, a second cascode stage having transistors 624 and 626 and transmission line elements 618 and 620, and a third cascode stage having transistors 628 and 630 and transmission line elements 628 and 630. The operation of cascode core 600 proceeds along the same principles of the single cascode embodiments described above. The bias voltage for the first cascode stage is VBIASC1 that is decoupled by capacitor 612; the bias voltage for the second cascode stage is VBIASC2 that is decoupled by capacitor 622, and the bias voltage for the first cascode stage is VBIASC3 that is decoupled by capacitor 632. In alternative embodiments, a frequency doubler using a multi-cascode architecture may have two cascode stages or greater than three cascode stages.

In accordance with an embodiment, a frequency doubling circuit includes a differential transistor pair coupled to an input port of the frequency doubling circuit, a first differential cascode stage having an input coupled to an output of the differential transistor pair, a plurality of first impedance elements coupled between the output of the differential transistor pair and the input of the first differential cascode stage, and an output combining network coupled between the first differential cascode stage and an output port of the frequency doubling circuit. The differential transistor pair may include a first plurality of bipolar junction (BJT) transistors, and the first differential cascode stage may include a second plurality of BJTs. Alternatively, field effect transistors such as MOSFETs and JFETs may be used.

In an embodiment, the plurality of first impedance elements are transmission line elements. Alternatively, inductors may be used in place of the transmission line elements. The plurality of first impedance elements may be configured to provide an impedance match between the output of the differential transistor pair and the input of the first differential cascode stage. Furthermore, the frequency doubling circuit may configured to operate at an input frequency of greater than 30 GHz.

In an embodiment, the output combining network includes a plurality of second impedance elements coupled between the output of the first differential cascode stage and a common node, and an output matching network coupled between the common node and the output port of the frequency doubling circuit. In some cases, the plurality of second impedance elements and the output matching network are implemented using transmission line elements. Alternatively, the plurality of first impedance elements may be implemented using inductors.

In various embodiments, the differential transistor pair, the first differential cascode stage, the plurality of first impedance element and the output combining network are disposed in an integrated circuit. Also, in some embodiments, the frequency doubling circuit may include a second differential cascode stage having an input coupled to an output of the first differential cascode stage, and a plurality of third impedance elements coupled between the output of the first differential cascode stage and the input of the second differential cascode stage.

In accordance with a further embodiment, a semiconductor circuit includes an input stage having a first transistor and a second transistor. Bases of the first transistor and the second transistor are coupled to an input port, and an emitter of the first transistor is coupled to an emitter of the second transistor. The semiconductor circuit further includes a cascode stage including a third transistor and a fourth transistor, a first transmission line element coupled between a collector of the first transistor and an emitter of the third transistor, a second transmission line element coupled between a collector of the second transistor and an emitter of the fourth transistor, and an output stage having a first input coupled to a collector of the third transistor, a second input coupled to a collector of the fourth transistor, and an output coupled to an output port.

In an embodiment, the output stage includes a third transmission line element coupled between the collector of the third transistor and a common node, a fourth transmission line element coupled between the collector of the fourth transistor and the common node, and a matching network including at least one transmission line coupled between the common node and the output port of the circuit. The semiconductor circuit may also include a first quarter wave transmission line coupled between the common node and a power supply node. The first quarter wave transmission line is configured to have a quarter wave frequency of about twice an input frequency of the circuit at the input port.

In an embodiment, the semiconductor circuit further includes a second quarter wave transmission line coupled between the emitters of the first and second transistors and a supply reference node, which may be a ground node or other reference node. In some embodiments, the input port is configured to be coupled to a driving stage and/or the output port is configured to provide an output signal having a frequency that is twice a frequency of a signal at the input port. The frequency of the signal at the input may be greater than 30 GHz.

In accordance with a further embodiment, a method of doubling a frequency includes providing a first signal having a first frequency to an input port of a frequency doubling circuit including a differential transistor pair coupled to an input port of the frequency doubling circuit, a differential cascode stage having an input coupled to an output of the differential transistor pair, a plurality of first transmission line elements coupled between the output of the differential transistor pair and the input of the differential cascode stage, and an output combining network coupled between the differential cascode stage and an output port of the frequency doubling. The method also includes receiving a second signal from the output port of the frequency doubling circuit, such that the second signal has a second frequency that is twice the first frequency. In some embodiments, the first frequency is greater than 30 GHz.

In an embodiment, providing a first signal includes providing the first signal to an integrated circuit comprising the frequency doubling circuit. Moreover, providing the first signal may include providing the first signal from a local oscillator (LO) buffer.

An advantage of embodiments includes the ability to implement a frequency doubler circuit that achieves high power and strong fundamental rejection at mm-wave frequencies. An advantage of embodiments having a high second harmonic conversion gain include the ability to reduce the LO power necessary to produce a strong second harmonic.

Another advantageous aspect of some embodiments of the present invention is the ability to directly use the output of an embodiment frequency doubler as a transmitter output for applications requiring a low transmitted output power. In such an embodiment, a power amplifier stage may be eliminated.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, in the embodiment examples presented herein, transmission line segments may be replaced with inductors.

What is claimed is:

1. A frequency doubling circuit comprising:
    a differential transistor pair coupled to an input port of the frequency doubling circuit;
    a first differential cascode stage having an input coupled to an output of the differential transistor pair;
    a plurality of first impedance elements coupled between the output of the differential transistor pair and the input of the first differential cascode stage; and
    an output combining network coupled between the first differential cascode stage and an output port of the frequency doubling circuit.

2. The frequency doubling circuit of claim 1, wherein:
    the differential transistor pair comprises a first plurality of bipolar junction (BJT) transistors; and the first differential cascode stage comprises a second plurality of BJTs.

3. The frequency doubling circuit of claim 1, wherein the plurality of first impedance elements comprises transmission line elements.

4. The frequency doubling circuit of claim 1, therein the plurality of first impedance elements comprise inductors.

5. The frequency doubling circuit of claim 1, wherein the plurality of first impedance elements is configured to provide an impedance match between the output of the differential transistor pair and the input of the first differential cascode stage.

6. The frequency doubling circuit of claim 1, wherein the frequency doubling circuit is configured to operate at an input frequency of greater than 30 GHz.

7. The frequency doubling circuit of claim 1, wherein the output combining network comprises:
a plurality of second impedance elements coupled between the output of the first differential cascode stage and a common node; and
an output matching network coupled between the common node and the output port of the frequency doubling circuit.

8. The frequency doubling circuit of claim 7, wherein the plurality of second impedance elements and the output matching network comprises transmission line elements.

9. The frequency doubling circuit of claim 1, wherein the differential transistor pair, the first differential cascode stage, the plurality of first impedance element and the output combining network are disposed in an integrated circuit.

10. The frequency doubling circuit of claim 1, further comprising:
a second differential cascode stage having an input coupled to an output of the first differential cascode stage; and
a plurality of third impedance elements coupled between the output of the first differential cascode stage and the input of the second differential cascode stage.

11. A semiconductor circuit comprising:
an input stage comprising a first transistor and a second transistor, wherein bases of the first transistor and the second transistor are coupled to an input port, and an emitter of the first transistor is coupled to an emitter of the second transistor;
a cascode stage comprising a third transistor and a fourth transistor;
a first transmission line element coupled between a collector of the first transistor and an emitter of the third transistor;
a second transmission line element coupled between a collector of the second transistor and an emitter of the fourth transistor; and
an output stage having a first input coupled to a collector of the third transistor, a second input coupled to a collector of the fourth transistor, and an output coupled to an output port.

12. The circuit of claim 11, wherein the output stage comprises:
a third transmission line element coupled between the collector of the third transistor and a common node;
a fourth transmission line element coupled between the collector of the fourth transistor and the common node; and
a matching network comprising at least one transmission line coupled between the common node and the output port of the circuit.

13. The circuit of claim 12, further comprising a first quarter wave transmission line coupled between the common node and a power supply node, wherein the first quarter wave transmission line is configured to have a quarter wave frequency of about twice an input frequency of the circuit at the input port.

14. The circuit of claim 11, further comprising a second quarter wave transmission line coupled between the emitters of the first and second transistors and a supply reference node.

15. The circuit of claim 14, wherein the supply reference node comprises a ground node.

16. The circuit of claim 11, wherein the input port is configured to be coupled to a driving stage.

17. The circuit of claim 11, wherein the output port is configured to provide an output signal having a frequency that is twice a frequency of a signal at the input port.

18. The circuit of claim 17, wherein the frequency of the signal at the input is greater than 30 GHz.

19. A method of doubling a frequency, the method comprising:
providing a first signal having a first frequency to an input port of a frequency doubling circuit comprising
a differential transistor pair coupled to an input port of the frequency doubling circuit,
a differential cascode stage having an input coupled to an output of the differential transistor pair,
a plurality of first transmission line elements coupled between the output of the differential transistor pair and the input of the differential cascode stage, and
an output combining network coupled between the differential cascode stage and an output port of the frequency doubling; and
receiving a second signal from the output port of the frequency doubling circuit, the second signal having a second frequency that is twice the first frequency.

20. The method of claim 19, wherein the first frequency is greater than 30 GHz.

21. The method of claim 19, wherein providing a first signal comprises providing the first signal to an integrated circuit comprising the frequency doubling circuit.

22. The method of claim 19, wherein providing the first signal comprises providing the first signal from a local oscillator (LO) buffer.

* * * * *